United States Patent [19]

Juntunen

[11] Patent Number: 5,604,684
[45] Date of Patent: Feb. 18, 1997

[54] EMBEDDED PROGRAMMABLE SENSOR CALIBRATION METHOD

[76] Inventor: Robert D. Juntunen, 5767 Vine Hill Rd., Minnetonka, Minn. 55345

[21] Appl. No.: 175,908

[22] Filed: Dec. 30, 1993

[51] Int. Cl.$^6$ ........................................ G01F 1/60
[52] U.S. Cl. ................ 364/571.04; 364/571.07
[58] Field of Search .................. 364/571.04, 571.05, 364/442, 483, 571.07; 73/1 R, 1 D, 1 B, 3; 454/229; 219/378

[56] References Cited

U.S. PATENT DOCUMENTS

| | | | |
|---|---|---|---|
| 3,720,813 | 3/1973 | Badessa | 364/571.05 |
| 4,097,860 | 6/1978 | Araseki et al. | 364/571.05 |
| 4,179,740 | 12/1979 | Malin | 364/442 |
| 4,254,469 | 3/1981 | Whitely | 364/571.05 |
| 4,364,027 | 12/1982 | Murooka | 364/571.05 |
| 4,372,166 | 2/1983 | Loveland | 364/571.05 |
| 4,645,908 | 2/1987 | Jones | 219/378 |
| 5,138,837 | 10/1992 | Shaffer et al. | 364/464.04 |
| 5,292,280 | 3/1994 | Janu et al. | 454/229 |
| 5,311,762 | 5/1994 | Drexel | 73/3 |
| 5,321,638 | 6/1994 | Witney | 364/571.05 |

*Primary Examiner*—Ellis B. Ramirez
*Assistant Examiner*—Kyle J. Choi
*Attorney, Agent, or Firm*—Robert B. Leonard

[57] ABSTRACT

A method for quick and low cost calibration of a sensor to remove span and offset errors. Span and offset errors are removed using a circuit which produces a corrected output signal as a function of calculated gain and offset values. The gain and offset values are calculated by first measuring an uncorrected sensor output at no input and at full scale output. These values are then used in an equation to calculate offset and gain values. The circuit includes an amplifier, a switch, a gain circuit, an offset circuit and a memory. The memory, which may be serial written memory including static RAM and a shift register, stores gain and offset coefficients for use by the gain and offset circuits and the amplifier. The gain and offset circuits may include digital to analog converters for converting the stored gain and offset digital values into analog equivalents.

4 Claims, 3 Drawing Sheets

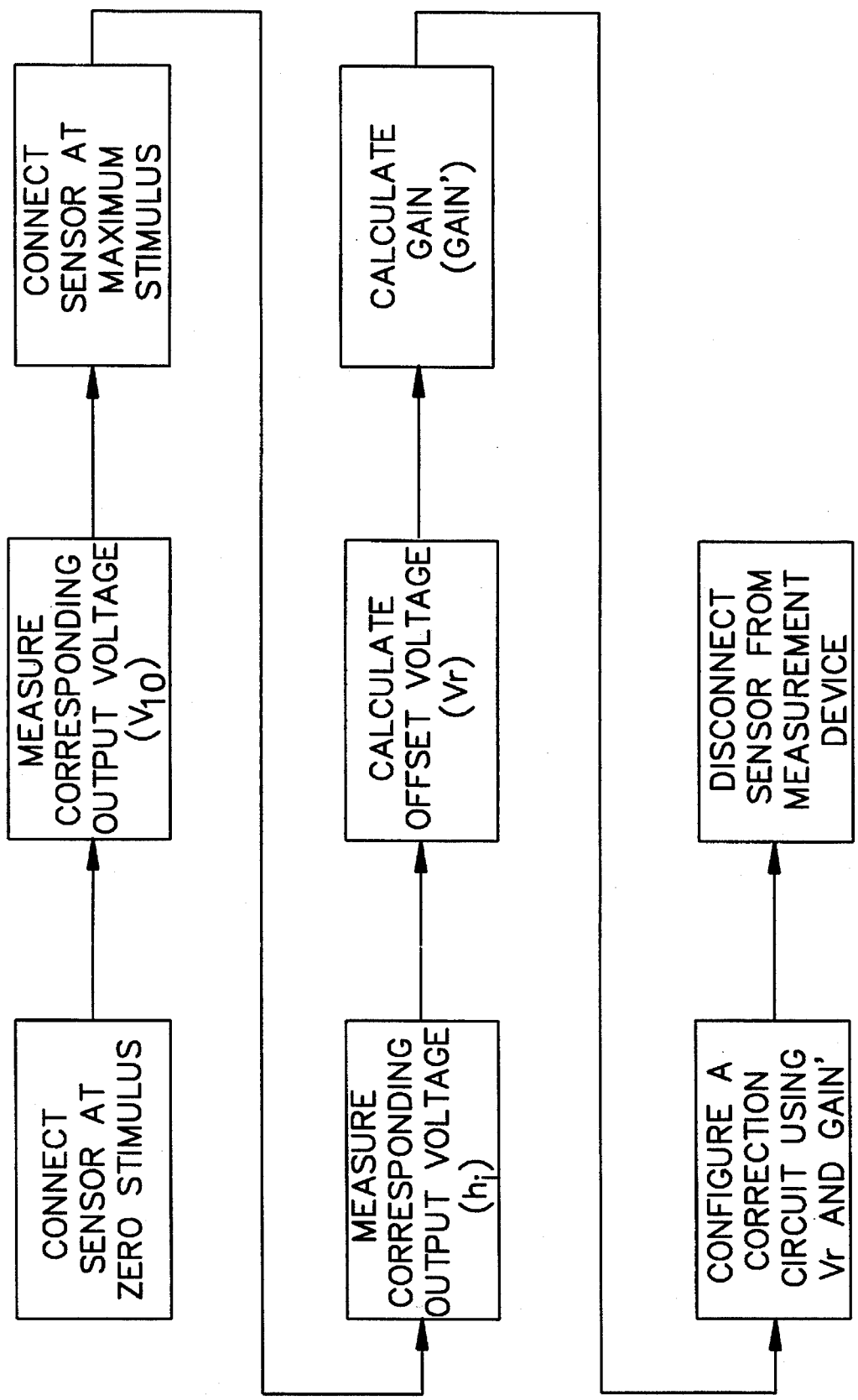

EMBEDDED PROGRAMMABLE SENSOR CALIBRATION METHOD

BACKGROUND OF THE INVENTION

The present invention relates to the field of sensors and is more particularly directed to the area of calibration of sensors. This application is related to U.S. patent application Ser. No. 08/175,911 entitled "Embedded Programmable Sensor Apparatus by the same applicant and is commonly assigned with the present application.

Since the inception of electronic sensors, calibration of sensors have imposed a substantial cost on sensor cost to the end user of the sensor. Generally, three calibrations were required depending upon the end use of the sensor.

An initial calibration was usually performed by the sensor manufacturer to make sure that broad desired tolerances are met. This calibration process in current times involved laser tailoring of a bias resistor network to a desired resistance. This process typically would require multiple passes and total elapsed times in excess of 20 seconds when using median grade performance equipment.

Next, an original equipment manufacturer (OEM) would perform a calibration to ensure that the sensor met its needs. This was usually done by including at least one multi-turn potentiometer with the sensor and adjusting the potentiometer in a well known way until the desired performance characteristics were achieved. Finally, an epoxy could be placed on the potentiometer to freeze the setting. This was an expensive process.

Lastly, performance characteristics of sensors were affected by the conditions in which they were used in the field. Accordingly, field calibration was necessary to ensure that sensor performance was acceptable once the sensor was installed in its intended application. Usually, this calibration involved further adjustments to multi-turn potentiometers.

One particular sensor of interest here was a flow sensor. Flow sensors were often used in Heating, Ventilating and Air Conditioning applications for, as an example, measuring air flow through ducts. This information could be used to control the temperature of a controlled room. Typically, such sensors were located within a HVAC controller. The controller typically operated on instructions stored by a memory and executed by a clocked arithmetic logic unit (ALU). The controller itself could be located within the overhead space of the room. This could make manual adjustment of potentiometers difficult once the controller was installed.

Accordingly, it is an object of the present invention to substantially eliminate the need for factory laser trimming of resistors during the calibration of sensors. It is a further object of the present invention to substantially reduce the need for using potentiometers to calibrate the sensor. It is yet another object of the present invention to reduce the cost of calibrating the sensor. It is still another object of the present invention to reduce the manual labor required to calibrate the sensor.

SUMMARY OF THE INVENTION

The present invention is a method for calibrating a sensor which is used in connection with a clocked ALU and memory. At manufacture, an uncalibrated output, at a zero input level of the sensor, is generated and the output voltage of the sensor is recorded. The sensor is then stimulated at its top input level and the output voltage is again recorded. These are commonly known as the null and full scale output specifications of the sensor. Coefficients are then calculated by a processor for use in the programmable amplifier to bring the null and full scale amplified outputs within a usable range for a desired analog to digital converter. The coefficients are then used to affect the gain of an amplifier which adjusts the sensor output signal to produce a corrected output signal.

The invention operates in a device which includes an amplifier means for amplifying signals received from the sensor, a reference voltage supply for connection to the sensor and connected to the amplifier means, an offset circuit connected to the amplifier and for connection to the ALU and memory for adjusting the gain of the amplifier to correct for a known offset, a gain circuit connected to the amplifier means and for connection to the ALU and memory for adjusting the gain of the amplifier means based upon a desired full scale output and a switching means connected to the amplifier means, the gain circuit and the ALU for multi-plexing a pre-amplifier output and a programmable amplifier output.

In a preferred embodiment, the a pre-amplifier is included in the correction circuit between the programmable amplifier and the sensor. A switch is also located at the output ports of the amplifier and the pre-amplifier and connected to the processor. At start up of the sensor, the pre-amplifier output signal is used to determine the coefficients by shutting off the output of the amplifier and directing the pre-amplifier signal to the processor. After the coefficients have been calculated, the pre-amplifier's connection to the processor is shut off at the switch, and the amplifier's output signal is used thereafter by the processor.

In another preferred embodiment, the coefficients are stored in a serial written memory which includes static random access memory (SRAM) and a shift register. The coefficients are then constantly applied to the gain section and the digital to analog converter for use by the amplifier.

BRIEF DESCRIPTION OF THE DRAWING

FIG. 4 is a schematic diagram of the process steps and equations used to calculate the voltage offset and gain.

DETAILED DESCRIPTION OF THE PREFERRED EMBODIMENT

Figure 1:
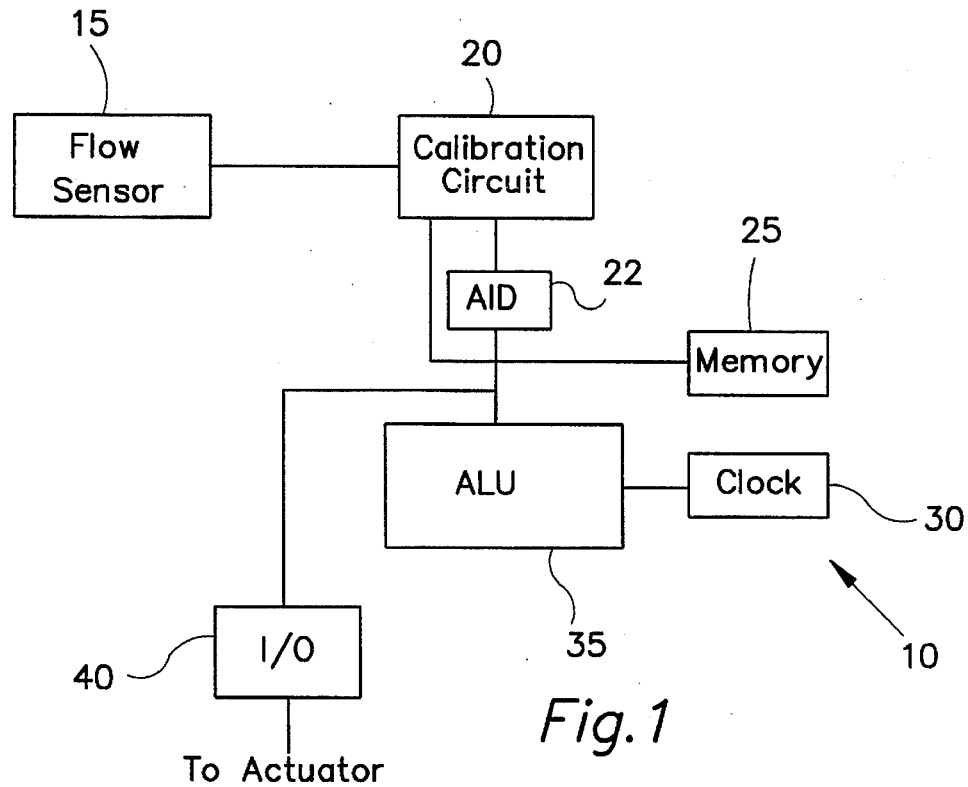
FIG. 1 is a block diagram of a controller which incorporates the inventive method.

Referring now to FIG. 1, there shown is a controller 10 which incorporates the inventive method. The controller 10 includes a sensor 15 connected to a calibration circuit 20. The calibration circuit 20 is connected to analog to digital converter 22, arithmetic logic unit (ALU) 35, memory 25 and input/output port 40. The ALU is connected to a clock 30.

In operation, sensor 15 produces a sensor signal representative of a condition to be sensed. The sensor is connected to a calibration circuit 20 which uses an algorithm for correcting the sensor signal at null input and full scale output (FSO) variations. A digitized version of the corrected circuit is then sent to the ALU through analog to digital converter 22. Coefficients used in the algorithm are stored in memory 25. Memory 25, which may include both read only memory and random access memory, also stores instructions upon which ALU 35 operates. ALU 35, which may be a microprocessor, micro controller, microcomputer or the like, receives the corrected signal and instructions from the memory and produces a control signal which is sent out to a controlled device (not shown) through input output port 40. To ensure orderly operation and communications, clock 30 provides a timing signal which is used by all of the components of the controller.

Figure 2:
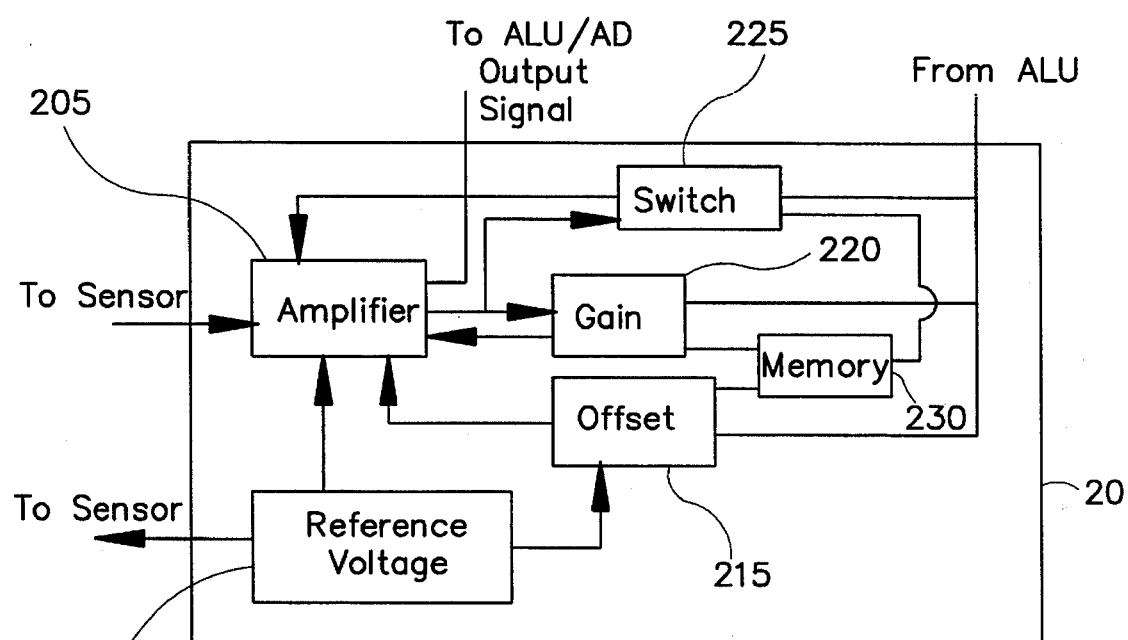
FIG. 2 is a block diagram of a preferred circuit which is used in the inventive method.

Referring now to FIG. 2, there shown is a block diagram of the calibration circuit 20 which is preferred for using the inventive method. It includes amplifier means 205, reference voltage generator 210, offset means 215, gain means 220 switch means 225 and memory 230. Amplifier 205 receives the sensor signal and amplifies the sensor signal to levels which can be used by the ALU. Amplifier 205 also amplifies the signal according to signals received from offset means 215 and gain means 220 to adjust the output signal to achieve desired span and offset characteristics. Reference voltage means 210 produces a reference voltage which is used by the sensor 15, the amplifier 205 and the offset means 215. By biasing these devices using a common reference voltage, the circuits will be subject to common variations in reference voltage which may be induce by temperature changes. Therefore, temperature effects on these circuits are ratiometrically canceled.

The switch means 225, gain means 220 and offset means 215 are controlled by information stored in memory 230. This information is supplied to the memory each time the sensor is started up from memory 25. Memory 230 may have components of Static RAM (SRAM), Non-Volatile Ram (NOVRAM) and Electrically Erasable Programmable ROM (EEPROM). The switch means 225 controls whether a corrected or amplified but uncorrected sensor signal is output from the Amplifier means 205 based on input received from the memory 230. Offset means 215 receives stored coefficients from memory 230 to correct the sensor signal for offset error. Gain means 220 receives coefficients from the memory 230 to correct the sensor signal for errors in the full scale output signal. More detail on this will be provided with reference to FIG. 3.

Figure 3:
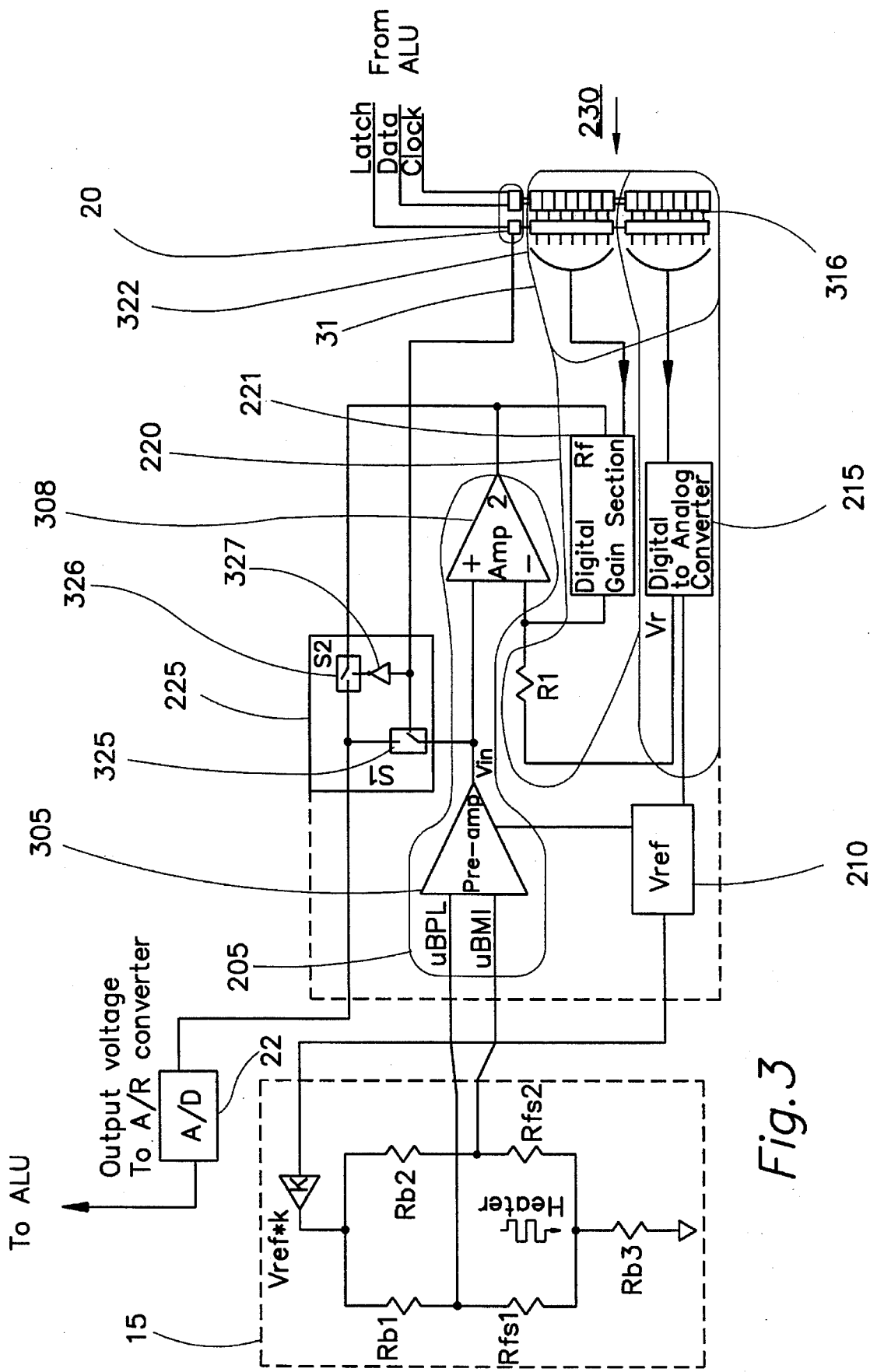
FIG. 3 is a schematic diagram of one embodiment of the circuit used with the present invention connected to a representative sensor.

Referring now to FIG. 3, there shown is a schematic diagram of a sensor 15 and the calibration circuit 20. The calibration circuit is further broken down and depicts a preferred embodiment of the circuit for operating the inventive method. The amplifier means 205 includes pre-amplifier 305 and amplifier 308. The pre-amplifier is used to scale the sensor output signal to levels which are usable by the ALU. Amplifier 308 may be programmable to a desired gain level and is affected by the output of the offset means 215 and the gain means 220.

Offset means 215 includes a digital to analog converter. Gain means 220 includes resistor R1 and gain section 221.

Memory 230 includes digital to analog converter memory section 316, gain memory section 321 and latch memory section 322. These memory sections take the form of serial written memory.

Switch means 225 includes switches 325 and 326 and not gate 327. Analog to digital converter 350 is used to convert the output signal to a form which can be stored and used by the ALU.

Gain section 221 in a preferred embodiment is a ladder type digital to analog converter having a desired transfer function. The same is true for digital to analog converter 215. The selection of the transfer function and structure of these converters is a matter of design choice for the specific application and is well known to those of ordinary skill in the art. In the present circuit, these converters are constructed of seven resistors which can be selectively chosen to create a desired resistance.

Sensor 15 may be any sensor designed to produce a differential output signal. Here, the flow sensor is configured as a Wheatstone Bridge with resistors Rbl, Rb2, Rfsl and Rfs2 as the legs of the bridge. Resistor Rb3 provides level shifting of the differential voltage developed at the positive and negative inputs of pre-amplifier 305. The sensor may be a flow sensor such as the Honeywell AWM series of flow sensors.

At time for calibration, the invention operates as follows. First, switch 325 is enabled and switch 326 is disabled by writing a 1 to the first bit of the serial written memory. All other bits are don't cares at this point.

Next, the sensor is placed in a condition where zero stimulus is applied to the sensor (0 input level) and the sensor output value is stored in memory (Vlo). The sensor is then stimulated at a level in which it is to produce a full scale output and the sensor output value is stored in memory (Vhi).

These two values are then plugged into the equation:

$$Vr=(Vhi*Vo2-Vlo*Vo1)/(Vhi-Vo1-Vlo+Vo2);$$

Where, Vo2 is the desired voltage output at 0 sensor input (in a preferred embodiment, 0.50 Vdc);

Vo1 is the desired voltage output at full scale output (in a preferred embodiment, 4.50 Vdc); and Vr is the required offset voltage.

Next, the gain can be calculated using the Vr just calculated:

$$Rf=((Vhi-Vo1)*R1)/(Vr-Vhi);\ and$$

$$Gain'=Rf/Rp.$$

The value of R1 is chosen such that the desired output of the programmable amplifier and the gain section are achieved. The method of picking such a resistor is well known to those of ordinary skill in the art: here, the applicant has chosen R1=4990 Ohms.

Note that the term "Gain'" refers only to the ratio of Rf to R1, the true output voltage of amplifier 308 is defined as Vo=(Gain'+1)*Vin+Vr* (Gain'). Vin is the output of the pre-amplifier.

It should be noted that the switch means 225 and latch memory section are not necessary in the basic embodiment of the present invention. These functions may be implemented by a circuit connected to the sensor output only during calibration. Once calibration is completed, these functions are no longer necessary and the external circuit could be disconnected. The Vr and Gain' values could then still be loaded as described herein.

Once the gain and Vr values are determined, decimal equivalent values of Gain' and Vr can be calculated. These values are dependent upon the transfer function and resolution of the gain section, and the analog to digital converter. In the present case:

$$Dec(Offset)=Int((Vref*12.8/Vr)-44.8)).$$

$$Dec(gain)=Int((336/Gain')-32+0.1)$$

(Vref is, in a preferred embodiment, =5.45 V)

Next, the decimal codes just calculated are arranged with the offset code first, the gain code second, and a 0 as the last bit in order to shut off the switch 325 and turn on switch 326. The codes are then put into the memory sections and the corrected sensor output signal is checked against the desired null and full scale output levels by again stimulating the sensor at these levels. If the output levels at these input levels meet the predefined criteria, the offset and gain decimal codes are stored in memory 25 and are used during the operation of the sensor.

At startup of the sensor, the digital values of Vr and Gain' are loaded from memory 25 to the appropriate memory sections in memory 230 (Vr in digital to analog converter memory section 316, Gain' in gain section memory 321 and a digital one in latch memory section 322. Thereafter, the corrected output signal sent to analog to digital converter 350 is corrected by the Gain' and Vr values through the circuit shown in FIG. 3.

The foregoing has been a description of a novel and non-obvious method for correcting a sensor signal for offset and null errors. Many minor variations which fall within the spirit of the invention will be obvious to those of ordinary skill in the art. The applicant does not intend for the description to be limiting but instead define the limits of their invention through the claims appended hereto.

I claim:

1. A method for establishing a voltage level for an output signal from a sensor and its associated correction circuit, the sensor having a desired null output level achieved by said correction circuit that is substantially equal to Vo2 and a desired full scale output equal to Vo1, said Vo1 and Vo2 levels being the approximate range of acceptable input to an analog to digital converter that accepts output from said correction circuit, the correction circuit comprising an amplifier having first and second input ports and an output port said output port supplying said output level as its output, and a resistance R1 connected to provide an offset signal to said second input port, the sensor being connected to the first input port, wherein the method for providing a voltage value for said offset signal comprises the steps of:

(a) connecting the sensor output to a measurement device so as to be able to measure the output signal of the sensor at a zero stimulus level (named Vlo) and at a full scale level (named Vhi), said connection to a measurement device being named a measurement configuration;

(b) measuring the output signal of the sensor at both Vlo and Vhi;

(c) based on these measurements, determining the offset voltage value (named Vr) by calculating the relationship defined as:

$$Vr = (Vhi*Vo2 - Vlo*Vo1)/(Vhi - Vo1 - Vlo + Vo2);$$

(d) based again on these measurements and the determined Vr, determining a gain voltage value (named gain') for correcting the sensor output signal for span error using the equations:

$$Rf = ((Vhi - Vo1)*R1)/(Vr - Vhi)$$

$$gain' = Rf/R1;$$

(e) configuring the correction circuit to apply said gain voltage and said offset voltage values to said first input port of said amplifier; and (f) disconnecting the sensor output from said measurement device.

2. The method of claim 1 wherein said correction circuit further includes a pre-amplifier having input ports connected to the sensor and an output terminal connected to the first input port of the amplifier, and a switch means connected to the output ports of the pre-amplifier and the amplifier and the input port of a processor to determine said values in said measurement configuration, comprising the further steps of:

(g) enabling the output port of the preamplifier and disabling the output port of the amplifier so that only a pre-amplified signal is used by the processor at least during steps (a) and (b); and (h) enabling the output port of the amplifier and disabling the output port of the pre-amplifier for at least step (f).

3. The method of claim 2, wherein the correction circuit further comprises memory which can be loaded with values corresponding to the determined values, a shift register connected to the memory, and a gain and offset digital to analog converter circuit connected to receive output from said shift register and deliver output to said first input port of said amplifier, comprising the further steps of:

(g) storing a digital equivalent of said determined values in the memory; and (h) sending through said shift registers said digital equivalents to the offset and gain digital to analog converter circuit to produce analog offset and gain values; and (i) applying said analog offset and gain values to said first input port of said amplifier.

4. The method of claim 1, wherein the correction circuit further comprises memory which can be loaded with values corresponding to the determined values, a shift register connected to the memory, and a gain and offset digital to analog converter circuit connected to receive output from said shift register and deliver output to said first input port of said amplifier, comprising the further steps of:

(g) storing a digital equivalent of said determined values in the memory; and (h) sending through said shift registers said digital equivalents to the offset and gain digital to analog converter circuits to produce analog offset and gain values; and (i) applying said analog offset and gain values to said first input port of said amplifier.

* * * * *